(12) United States Patent
Xue et al.

(10) Patent No.: US 9,742,302 B2
(45) Date of Patent: Aug. 22, 2017

(54) ZERO-CROSSING DETECTION CIRCUIT AND SWITCHING POWER SUPPLY THEREOF

(71) Applicant: Silergy Semiconductor Technology (Hangzhou) LTD, Hangzhou, ZheJiang Province (CN)

(72) Inventors: Chaoyao Xue, Hangzhou (CN); Hongfeng An, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 32 days.

(21) Appl. No.: 14/957,094

(22) Filed: Dec. 2, 2015

(65) Prior Publication Data

US 2016/0172979 A1   Jun. 16, 2016

(30) Foreign Application Priority Data

Dec. 15, 2014   (CN) .......................... 2014 1 0769305

(51) Int. Cl.
*G05F 1/40* (2006.01)
*H02M 5/293* (2006.01)
*H02M 1/08* (2006.01)
*G01R 19/175* (2006.01)

(52) U.S. Cl.
CPC .......... *H02M 5/293* (2013.01); *G01R 19/175* (2013.01); *H02M 1/083* (2013.01)

(58) Field of Classification Search
CPC ........ G01R 19/175; H02M 2005/2935; H02M 1/083; H02M 5/293; H02M 1/047; H02M 1/38; H02M 2001/0009; H03K 17/13; H03K 17/133; H03K 17/136; H03K 5/1536
USPC ........................................ 323/235, 319, 282
See application file for complete search history.

(56) References Cited

U.S. PATENT DOCUMENTS

| 6,756,771 | B1 | 6/2004 | Ball et al. | |
| 8,416,587 | B2 | 4/2013 | Chen | |
| 2008/0246455 | A1* | 10/2008 | Chu | H02M 3/1588 323/283 |
| 2009/0027020 | A1* | 1/2009 | Qiu | H02M 3/1588 323/282 |
| 2015/0084613 | A1* | 3/2015 | Ho | H02M 3/1588 323/299 |
| 2015/0145489 | A1 | 5/2015 | Hou et al. | |

(Continued)

*Primary Examiner* — Alex Torres-Rivera
(74) *Attorney, Agent, or Firm* — Michael C. Stephens, Jr.

(57) ABSTRACT

A zero-crossing detection circuit can include: a state judging circuit that generates a judging signal based on whether a body diode of a synchronous power switch is conducting when the synchronous power switch is off; a regulation voltage generator that reduces a regulation voltage when the judging signal indicates that the body diode is conducting, and increases the regulation voltage when the judging signal indicates that the body diode is not conducting, where a detection voltage includes a sum of the regulation voltage and a voltage at a first terminal of the synchronous power switch; and a comparison circuit that compares the detection voltage against a voltage at a second terminal of the synchronous power switch, and generates a zero-crossing detection signal that is activated to turn off the synchronous power switch when the detection voltage equals the voltage at the second terminal of the synchronous power switch.

10 Claims, 5 Drawing Sheets

(56) References Cited

U.S. PATENT DOCUMENTS

| | | |
|---|---|---|
| 2015/0180339 A1 | 6/2015 | Chen |
| 2015/0214829 A1 | 7/2015 | Xu et al. |
| 2016/0036436 A1* | 2/2016 | Hwang ................ H03K 17/133 |
| | | 327/109 |

* cited by examiner

ZERO-CROSSING DETECTION CIRCUIT AND SWITCHING POWER SUPPLY THEREOF

RELATED APPLICATIONS

This application claims the benefit of Chinese Patent Application No. 201410769305.9, filed on Dec. 15, 2014, which is incorporated herein by reference in its entirety.

FIELD OF THE INVENTION

The present disclosure generally relates to the field of power electronics, and more particularly to zero-crossing detection circuitry, and associated switching power supplies.

BACKGROUND

A switching power supply may typically include a power stage circuit and a control circuit. The control circuit can be used to regulate on and off times of a power switch in a switch-type converter based on variations of an input voltage, various internal parameters, and a load, so as to maintain an output voltage or an output current of the switching power supply as substantially constant. Therefore, control approaches are very important to the design of a switching power supply, and may affect the performance thereof. Different power supply results may be achieved with different detection signals and/or different control circuits.

SUMMARY

In one embodiment, a zero-crossing detection circuit can include: (i) a state judging circuit configured to generate a judging signal based on whether a body diode of a synchronous power switch is conducting when the synchronous power switch is off; (ii) a regulation voltage generator configured to reduce a regulation voltage when the judging signal indicates that the body diode is conducting, and to increase the regulation voltage when the judging signal indicates that the body diode is not conducting, where a detection voltage includes a sum of the regulation voltage and a voltage at a first terminal of the synchronous power switch; and (iii) a first comparison circuit configured to compare the detection voltage against a voltage at a second terminal of the synchronous power switch, and to generate a zero-crossing detection signal, where the zero-crossing detection signal is activated to turn off the synchronous power switch when the detection voltage equals the voltage at the second terminal of the synchronous power switch.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In a synchronous switching power supply, under light-load conditions, a synchronous switch may be turned off when an inductor current is reduced to zero during the "freewheeling process" in order to reduce power losses and improve conversion efficiency. In such operations, the inductor current can be in a discontinuous conduction mode (DCM). Also, a zero-crossing detection circuit can be utilized to detect if/when the inductor current crosses zero in the DCM mode.

Figure 1:
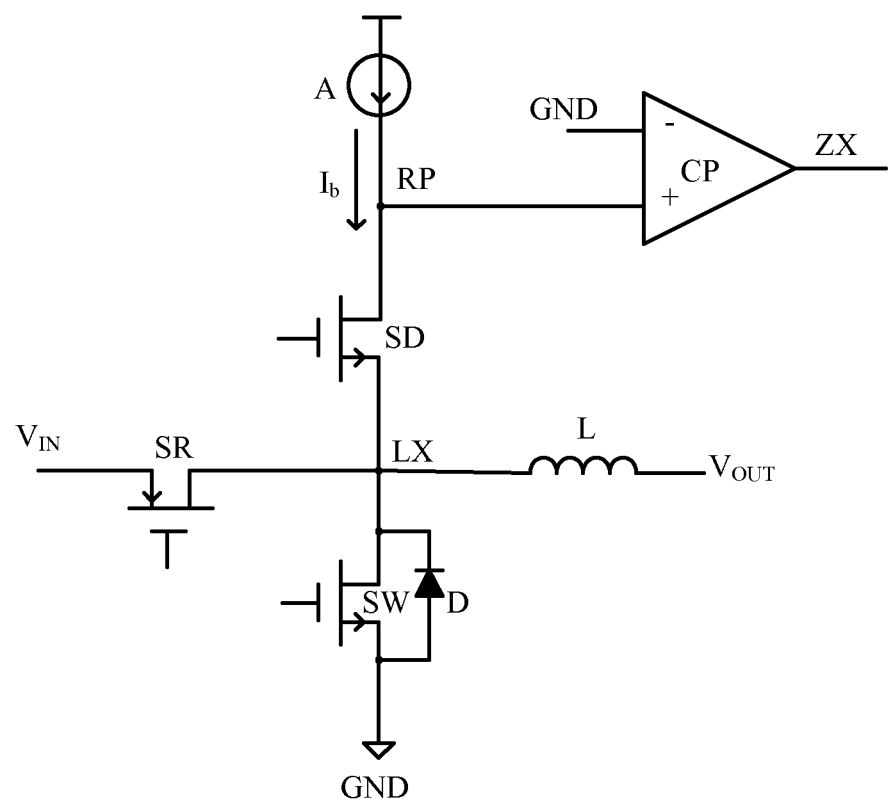
FIG. 1 is an example zero-crossing detection circuit for a buck-type synchronous switching power supply.

Referring now to FIG. 1, shown is an example zero-crossing detection circuit for a buck-type synchronous switching power supply. In this case, power switch SD can connect in series with synchronous power switch SW, and node LX is a common node of power switch SD and synchronous power switch SW. Bias current supply A can connect in series with power switch SD in order to provide bias current $I_b$. Comparator CP can compare the voltage at node RP against the voltage at GND (e.g., zero), and can generate zero-crossing detection signal ZX. When the voltage at node RP equals the voltage at GND (e.g., the zero-crossing detection point), the zero-crossing detection signal may be activated to control a logic circuit that controls a switching control signal (e.g., to turn off synchronous power switch SW). During the zero-crossing detection process, the inductor current relative to the zero-crossing point can be related to one or more fixed values (e.g., the bias current, the on resistance of synchronous power switch SW, the on resistor of power switch SD, etc.).

In a switching power supply, the rate of decrease of the inductor current may be different for different output voltages. When the inductor current relative to the zero-crossing point is fixed, the inductor current may not be reduced to zero (e.g., if the zero-crossing point is relatively large) or has been negative (e.g., if the zero-crossing point is relatively small) when the synchronous power switch is turned off for different output voltages. This may be because there is a delay time after the zero-crossing point is detected, and the inductor current may continue to decrease during this delay time, so as to adversely affect the efficiency of the switching power supply.

In one embodiment, a zero-crossing detection circuit can include: (i) a state judging circuit configured to generate a judging signal based on whether a body diode of a synchronous power switch is conducting when the synchronous power switch is off; (ii) a regulation voltage generator configured to reduce a regulation voltage when the judging signal indicates that the body diode is conducting, and to increase the regulation voltage when the judging signal indicates that the body diode is not conducting, where a detection voltage includes a sum of the regulation voltage and a voltage at a first terminal of the synchronous power switch; and (iii) a first comparison circuit configured to compare the detection voltage against a voltage at a second terminal of the synchronous power switch, and to generate a zero-crossing detection signal, where the zero-crossing detection signal is activated to turn off the synchronous power switch when the detection voltage equals the voltage at the second terminal of the synchronous power switch.

Figure 2:
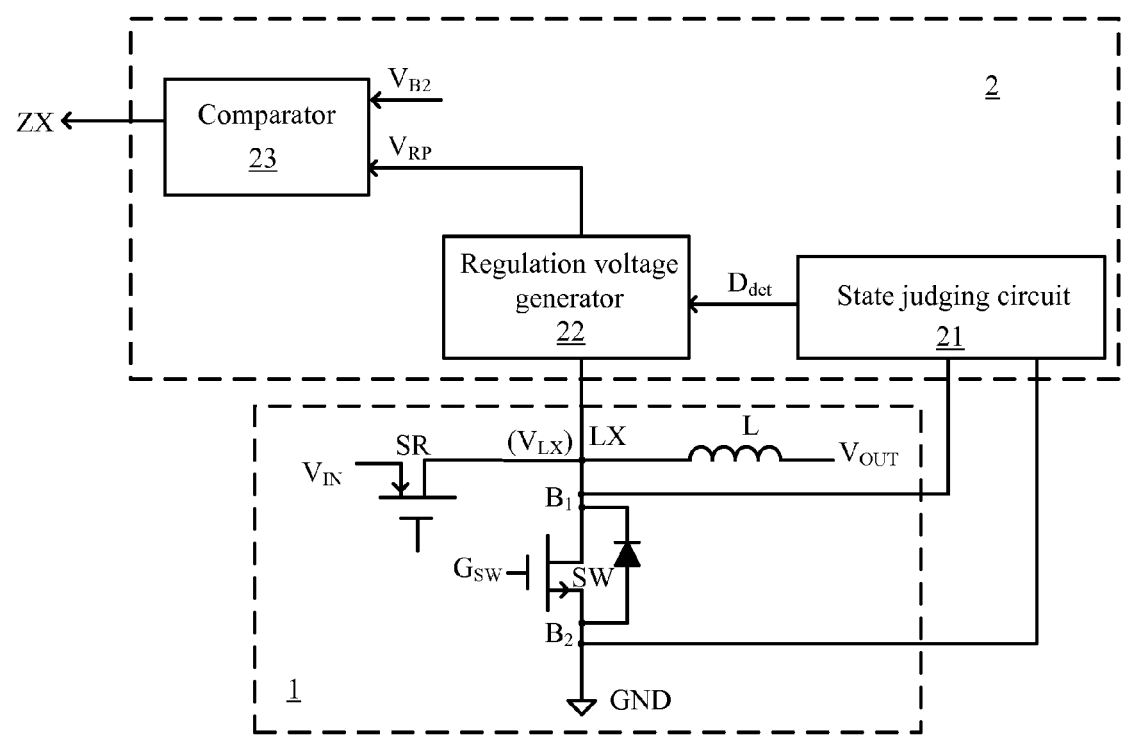
FIG. 2 is a schematic block diagram of an example zero-crossing detection circuit for a switching power supply, in accordance with embodiments of the present invention.

Referring now to FIG. 2, shown is a schematic block diagram of an example zero-crossing detection circuit for a switching power supply, in accordance with embodiments of the present invention. In this particular example, the switching power supply can include a power stage circuit 1 and zero-crossing detection circuit 2. Power stage circuit 1 can include synchronous power switch SW, main power switch SR, and inductor L, and terminal $B_1$ of synchronous power switch SW can be configured as common node LX. When the power stage circuit employs a buck topology, one terminal of main power switch SR can receive input voltage $V_{IN}$, and the other terminal of main power switch SR can connect to terminal $B_1$ of synchronous power switch SW. Terminal $B_2$ of synchronous power switch SW can connect to ground "GND," and one terminal of inductor L can connect to common node LX, while the other terminal of inductor L can provide output voltage $V_{OUT}$ of the switching power supply.

When the power stage circuit employs a boost topology, one terminal of main power switch SR can connect to ground GND, and the other terminal of main power switch SR can connect to terminal $B_1$ of synchronous power switch SW. Terminal $B_2$ of synchronous power switch SW can provide output voltage $V_{OUT}$. Also, one terminal of inductor L can receive input voltage $V_{IN}$ of the switching power supply, and the other terminal of inductor L can connect to common node LX. In a buck-type switching power supply, when main power switch SR is on, the synchronous power switch SW may be off, and the inductor current may gradually increase. When main power switch SR is off, synchronous power switch SW may be on, the inductor current can gradually decrease, and synchronous power switch SW may be turned off again when the inductor current is reduced to zero.

Zero-crossing detection circuit 2 can set a zero-crossing point for the inductor current, in order to turn off synchronous power switch SW when the inductor current is crossing zero. Zero-crossing detection circuit 2 can include state judging circuit 21, regulation voltage generator 22, and comparison circuit 23. State judging circuit 21 can determine if the body diode of synchronous power switch SW is conducting (on) when synchronous power switch SW is turned off, and may generate a "judging" signal (e.g., $D_{det}$).

Typically, synchronous power switch SW is implemented as a MOSFET that has a body diode, as shown. When synchronous power switch SW is turned off, the body diode may conduct if the inductor current has not been reduced to zero, due to a relatively large zero-crossing detection point. Otherwise, when synchronous power switch SW is turned off, the body diode may not conduct if the inductor current has already decreased to zero, or even less than zero, due to a relatively small or low zero-crossing detection point.

Therefore, state judging circuit 21 can be used to determine if the body diode is conducting when synchronous power switch SW is turned off. This can be used to determine if the present zero-crossing detection point is high or low, so as to adjust the zero-crossing detection point. Synchronous power switch SW can then be turned off when zero-crossing detection signal ZX is activated by zero-crossing detection circuit 2.

Regulation voltage generator 22 can generate regulation voltage $V_T$ according to the judging signal generated by state judging circuit 21. For example, the regulation voltage may decrease when the judging signal indicates that the body diode is on, and the regulation voltage can increase when the judging signal indicates the body diode is not conducting (off). Regulation voltage $V_T$ can then be added with voltage $V_{LX}$ in order to generate detection voltage $V_{RP}$. For example, a superposition circuit can be employed in order to perform this adding function. Regulation voltage generator 22 can connect to common node LX, so regulation voltage $V_T$ can be added with voltage $V_{LX}$, and regulation voltage generator 22 can generate detection voltage $V_{RP}$.

Comparison circuit 23 may compare detection voltage $V_{RP}$ against voltage $V_{B2}$ at terminal $B_2$ of synchronous power switch SW, and generate zero-crossing detection signal ZX. When detection voltage $V_{RP}$ is equal to voltage $V_{B2}$, zero-crossing detection signal ZX may be activated (e.g., go high), in order to turn off synchronous power switch SW. After synchronous power switch SW is turned off when zero-crossing detection signal ZX is activated, the body diode can be detected as to conducting or not at the turning off moment/time of synchronous power switch SW. Also, main power switch SR can be turned on via the control circuit of the switching power supply at substantially the same time, or after a delay time. In such a case, the inductor current may continuously rise, and zero-crossing detection signal ZX may be deactivated (e.g., go low). Then, main power switch SR may be turned off and synchronous power switch SW may be turned on. In this case, the inductor current may continuously decrease until detection voltage $V_{RP}$ equals voltage $V_{B2}$, and zero-crossing detection signal ZX is again activated in order to turn off synchronous power switch SW.

In zero-crossing detection circuit 2, the moment that detection voltage $V_{RP}$ equals voltage $V_{B2}$ can be the zero-crossing detection point set by zero-crossing detection circuit 2. The inductor current relative to the zero-crossing detection point $I_{L\_ZX}$ can be derived as follows: $V_T+V_{LX}=V_{B2}$; $V_T+V_{B2}-I_{L\_ZX}\times R_{dson}=V_{B2}$; $I_{L\_ZX}=V_T/R_{dson}$. Thus, when zero-crossing detection circuit 2 detects the zero-crossing point of the switching power supply, zero-crossing detection signal ZX may be activated when the inductor current is reduced to: $I_{L\_ZX}=V_T/R_{dson}$, where $R_{dson}$ is the on resistance of synchronous power switch SW (e.g., a fixed value based on the circuit configuration). Zero-crossing detection signal ZX can be provided to a logic circuit, such as an RS flip-flop having a reset terminal for receiving zero-crossing detection signal ZX, a set terminal for receiving a signal to control the turn on synchronous power switch SW, and an output terminal for generating a switching control signal for synchronous power switch SW.

Synchronous power switch SW may be turned off after a delay time has elapsed after activation of zero-crossing detection signal ZX, where the delay time is a fixed time determined by comparison circuit 23 and the logic circuit in a certain circuit configuration. The inductor current may be reduced to zero during the delay time by setting inductor current $I_{L\_ZX}$ at the zero-crossing detection point, and synchronous power switch SW may be turned off when the inductor current is reduced to zero. However, because the inductor current may decrease at different rate due to different output voltages $V_{OUT}$ of the switching power supply, the zero-crossing detection point set by zero-crossing detection circuit 2 can be regulated in real-time. In this way, inductor current $I_{L\_ZX}$ corresponding to the zero-crossing detection point may be increased or decreased in order to meet different requirements, rather than being a fixed value.

State judging circuit 21 can be used to determine if the body diode of synchronous power switch SW is turned on when the synchronous power switch is turned off. State judging circuit 21 can also determine if the inductor current corresponding to the present zero-crossing detection point is too high or too low. In response, regulation voltage $V_T$ can be adjusted by regulation voltage regulator 22 to regulate the zero-crossing detection point and corresponding inductor current $I_{L\_ZX}$. In this way, synchronous power switch SW may be turned off when the inductor current is zero, for adaptability to different cases of different output voltages.

For example, the zero-crossing detection point can be regulated by reducing regulation voltage $V_T$ via regulation voltage generator 22 when the judging signal indicates that the body diode is conducting, which indicates that the inductor current $I_{L\_ZX}$ corresponding to the zero-crossing detection point is too large/high because the inductor current has not reduced to zero when synchronous power switch SW is turned off. The zero-crossing detection point can also be regulated by increasing regulation voltage $V_T$ via regulation voltage generator 22 when the judging signal indicates that the body diode is not conducting, so as to increase inductor current $I_{L\_ZX}$ corresponding to the zero-crossing detection point.

Thus in particular embodiments, the zero-crossing detection circuit may determine (e.g., by state judging circuit 21) if the body diode of a synchronous power switch is conducting when the synchronous power switch is turned off. A regulation voltage can be generated (e.g., by regulation voltage generator 22) that changes along with the state of the body diode according to the judging result. A voltage obtained by adding the regulation voltage (e.g., $V_T$) with a voltage at a terminal (e.g., drain) of the synchronous power switch can be compared against a voltage at another terminal (e.g., source) of the synchronous power switch in order to generate a zero-crossing detection signal (e.g., ZX). In this way, different cases with different output voltages can be supported, and the zero-crossing detection circuit can be used to turn off the synchronous power switch when the inductor current is near zero, in order to effectively reduce power losses and improve conversion efficiency of the switching power supply.

For example, state judging circuit 21 can include a comparator that compares the voltage difference (e.g., $V_{LX}-V_{B2}$) between the voltages at terminals $B_1$ and $B_2$ of the synchronous power switch against a threshold voltage when synchronous power switch SW is turned off, and generates a judging signal. The judging signal can indicate that the body diode is conducting when the voltage difference is larger/greater than the threshold voltage, and can indicate that the body diode is not conducting when the voltage difference is smaller/less than the threshold voltage. For example, the forward voltage drop of the body diode can be in the range of hundreds of millivolts, and the voltage across the body diode can be about zero when the body diode is not conducting, so the threshold voltage can be set to be less than the forward voltage drop of the body diode in order to determine if the body diode is conducting.

Figure 3:
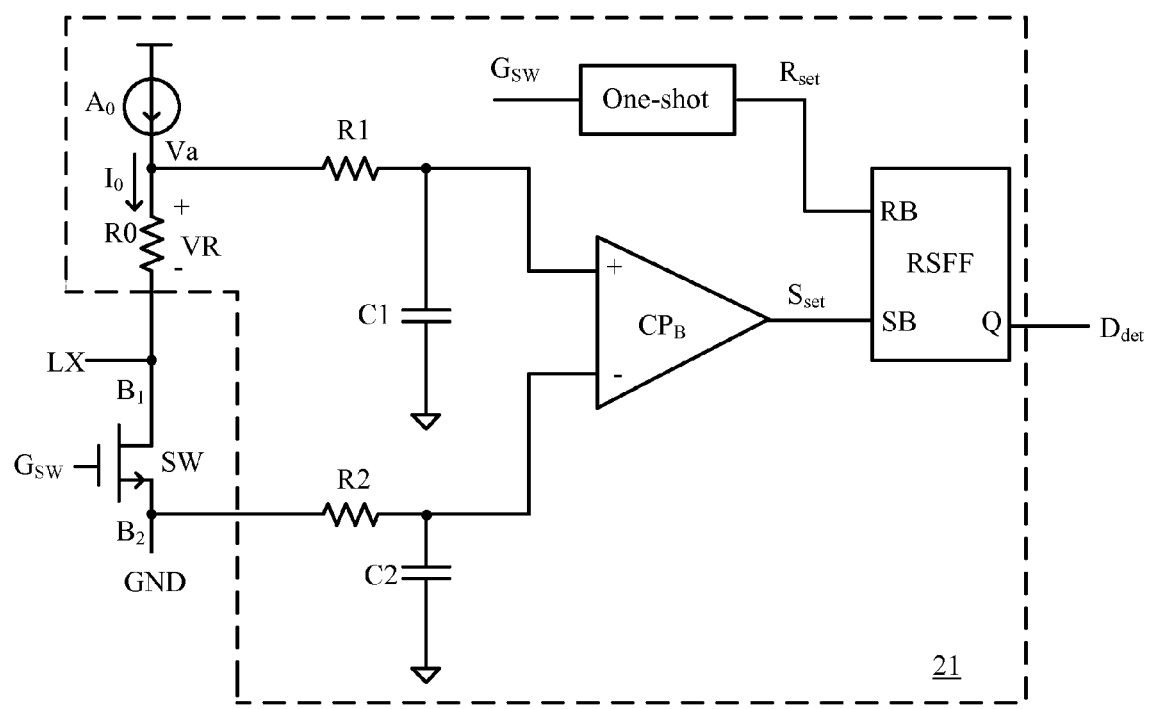
FIG. 3 is a schematic block diagram of an example state judging circuit according to the example of FIG. 2, in accordance with embodiments of the present invention.

Referring now to FIG. 3, shown is a schematic block diagram of an example state judging circuit according to the example of FIG. 2, in accordance with embodiments of the present invention. In this particular example, when node $B_2$ of synchronous power switch SW is grounded, state judging circuit 21 can include comparator $CP_B$, a threshold voltage generator, an RS flip-flop, and a relatively short-pulse signal generator "One-shot." The threshold voltage generator can generate threshold voltage VR that is smaller/less than the forward voltage drop of the body diode of synchronous power switch SW.

Comparator $CP_B$ can receive (e.g., via resistor R1) superposition voltage Va that is obtained by adding threshold voltage VR with voltage $V_{LX}$ at terminal $B_1$ of synchronous power switch SW. Comparator $CP_B$ can also receive (e.g., via resistor R2) voltage $V_{B2}$ from terminal $B_2$ of synchronous power switch SW, and may generate $S_{set}$ for the set terminal of the RS flip-flop. The RS flip-flop can receive pulse signal $R_{set}$ generated by the short-pulse signal generator at its reset terminal, and may generate judging signal $D_{det}$. Pulse signal $R_{set}$ can be generated by triggering the short-pulse signal generator with switching control signal $G_{SW}$. For example, the short-pulse generator may be triggered by the falling edge of switching control signal $G_{SW}$, in order to generate short-pulse signal $R_{set}$ (e.g., a high-going pulse).

Threshold voltage VR can be added with voltage $V_{LX}$ from terminal $B_1$ of the synchronous power switch via a superposition circuit. Threshold voltage VR can connect with voltage $V_{LX}$ at terminal $B_1$ of synchronous power switch, in order to obtain superposition voltage Va. The threshold voltage generator can include resistor R0 and current source $A_0$. Resistor R0 can connect with terminal $B_1$ of synchronous power switch SW, and to current source $A_0$. An output current $I_0$ of current source $A_0$ may flow through resistor R0, so as to obtain threshold voltage VR across resistor R0, such that the voltage at a terminal of resistor R0 is superposition voltage Va.

In this particular example, the comparison circuit can also include resistor R1 and capacitor C1. The first terminal of resistor R1 can connect with the second terminal of resistor R0, and the second terminal of resistor R1 can connect with the non-inverting input terminal of comparator $CP_B$. Capacitor C1 can connect between the second terminal of resistor R1 and ground. The RC delay circuit formed by resistor R1 and capacitor C1 can be utilized for precisely comparing the voltage difference with superposition voltage Va by comparator $CP_B$ at the moment when synchronous power switch SW is turned off. Similarly, such an RC delay circuit can also be employed between the inverting input terminal of comparator $CP_B$ and terminal $B_2$ of synchronous power switch SW, such as via resistor R2 and capacitor C2 as shown.

When $V_{LX}+VR>V_{B2}$, as terminal $B_2$ of the synchronous power switch is grounded, the anode of the body diode can connect with a "second" terminal (e.g., source/drain) of the synchronous power switch, and the cathode can connect to a "first" terminal (e.g., source/drain) of the synchronous power switch. When the voltage at terminal $B_2$ of the synchronous power switch is output voltage $V_{OUT}$ of the switching power supply, the anode of the body diode can connect to the first terminal of the synchronous power switch, and the cathode of the body diode can connect to the second terminal of the synchronous power switch. For example, when the absolute value of $V_{LX}-V_{B2}$ is less than VR, comparator $CP_B$ can generate a high level, so judging signal $D_{det}$ can be low if the flip-flop is triggered by a low level signal, which can indicate that the body diode is not conducting. Otherwise, judging signal $D_{det}$ being high can indicate that the body diode is conducting.

The "second" terminal of the synchronous power switch SW is grounded in this particular example, so a voltage obtained by adding voltage $V_{LX}$ at the first terminal of synchronous power switch SW with the threshold voltage can be compared against voltage $V_{B2}$ at terminal $B_2$, in order to judge/determine if the body diode of synchronous power switch SW is conducting. If the voltage at the second terminal of synchronous power switch SW is the output voltage of the switching power supply, a voltage obtained by adding voltage $V_{B2}$ at terminal $B_2$ of the synchronous power switch with the threshold voltage can be compared against voltage $V_{LX}$(at terminal $B_1$ of synchronous power switch SW to determine if the body diode of synchronous power switch SW is conducting. The voltage difference between the voltages at the first and second terminals of synchronous power switch SW can be compared against a threshold voltage to determine if the body diode is conducting, so as to eliminate the influence on the judging result that may be caused by the offset voltage of comparator $CP_B$. Therefore, threshold voltage VR may be set to a value (e.g., in the range of from about 0.1V to about 0.5V) between the offset voltage of comparator $CP_B$ and the forward voltage drop of the body diode.

Figure 4:
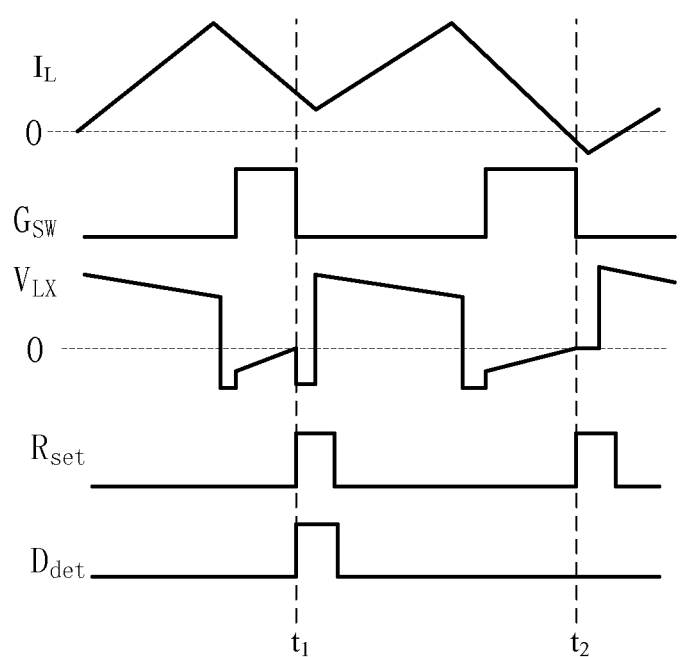
FIG. 4 is a waveform diagram of example operation of a zero-crossing detection circuit according to FIG. 2, in accordance with embodiments of the present invention.

Referring now to FIG. 4, shown is a waveform diagram of example operation of a zero-crossing detection circuit according to FIG. 2, in accordance with embodiments of the present invention. In this particular example, at time $t_1$, switching control signal $G_{SW}$ may go low to turn off synchronous power switch SW, but the body diode can be turned on because inductor current $I_L$ is not reduced to zero. Voltage $V_{LX}$ at common node LX can equal voltage $V_{B2}$ at terminal $B_2$ of the synchronous power switch minus the forward conduction voltage of the body diode. Because threshold voltage VR is less than the forward conduction voltage, output signal $S_{set}$ of the comparator can be low. Also, short-pulse signal $R_{set}$ input to the low-triggered reset terminal of RS flip-flop can go high in response to the falling edge of switching control signal $G_{SW}$. In some cases, pulse signal $R_{set}$ can be a low-going pulse instead of the high-going pulse as shown. Thus, judging signal $D_{det}$ generated by the RS flip-flop can go high to control regulation voltage $V_T$ to be reduced, and to further pull down the inductor current corresponding to the zero-crossing detection point.

At time $t_2$, synchronous power switch SW is turned off at the falling edge of switching control signal $G_{SW}$, and inductor current $I_L$ may be reduced to be less than zero (negative). In this case, the body diode is not conducting, and judging signal $D_{det}$ generated by the RS flip-flop can be low to control regulation voltage $V_T$ to be increased, and to further pull up the inductor current corresponding to the zero-crossing detection point. The example zero-crossing detection circuit may control the synchronous power switch of the switching power supply to be turned off when the inductor current is almost zero to accommodate difference cases with different output voltages. In this way, power losses can be effectively reduced, and the efficiency of the switching power supply can be improved.

Figure 5:
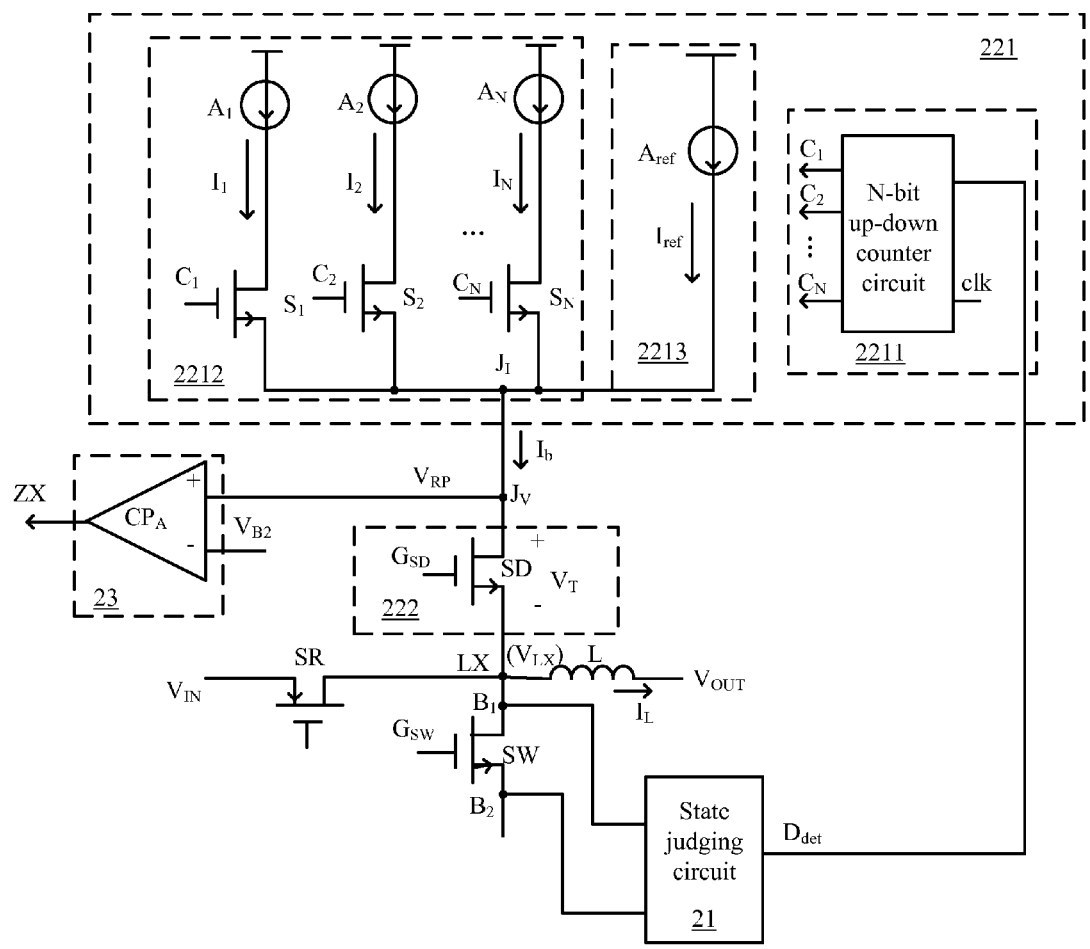
FIG. 5 is a schematic block diagram of an example zero-crossing detection circuit, in accordance with embodiments of the present invention.

Referring now to FIG. 5, shown is a schematic block diagram of an example zero-crossing detection circuit, in accordance with embodiments of the present invention. In this particular example, regulation voltage generator 22 (see, e.g., FIG. 2) can include bias current generator 221 and regulating switch 222. Bias current generator 221 may generate bias current $I_b$ according to judging signal $D_{det}$ generated by state judging circuit 21. Bias current $I_b$ can decrease when judging signal $D_{det}$ indicates the body diode of synchronous power switch SW is conducting, and may increase when judging signal $D_{det}$ indicates that the body diode is not conducting.

Bias current $I_b$ can flow from the "first" terminal (e.g., drain) of regulating switch 222 to the "second" terminal (e.g., source), so the conduction voltage of regulating switch 222 can be configured as regulation voltage $V_T$ of regulation voltage generator 22. Regulating switch 222 may be on when synchronous power switch SW is conducting. The second terminal of regulating switch 222 can connect with terminal $B_1$ of synchronous power switch SW, so regulation voltage $V_T$ of regulating switch 222 can connect to voltage $V_{LX}$(at terminal $B_1$ of synchronous power switch SW. Thus, the voltage at terminal $J_v$ of regulating switch 222 may be indicated as detection voltage $V_{RP}$.

Regulating switch 222 may be implemented by switch SD with the same or similar parameters as synchronous power switch SW (e.g., both MOSFETs). Thus, both of switches SD and SW may have the same or similar temperature compensation, in order to reduce influence on zero-crossing detection circuit 2 that may be caused by temperature or other variations, in order to further improve the accuracy of the zero-crossing detection circuit. Furthermore, switching control signal $G_{SD}$ of regulating switch SD can be substantially the same as switching control signal $G_{SW}$ of synchronous power switch SW. For example, regulating switch SD can be controlled by switching control signal $G_{SW}$. In other examples, regulating switch SD can be replaced by a resistor or other component(s) suitable to convert bias current $I_b$ to regulation voltage $V_T$.

For example, bias current generator 221 can include N-bit up-down counter circuit 2211, current regulating circuit 2212, and reference current generator 2213. When synchronous power switch SW is turned off, counter circuit 2211 can generate a counting signal according to judging signal $D_{det}$. The counting signal can control current regulating circuit 2212 in order to provide a regulating current that decreases when judging signal $D_{det}$ indicates the body diode of synchronous power switch SW is turned on, and that increases when the judging signal $D_{det}$ indicates that the body diode is not conducting.

The current obtained by adding the regulating current with reference current $I_{ref}$ generated by reference current generator 2213 is bias current $I_b$ generated by bias current generator 221. The regulating current and the reference current can be added, such as by a superposition circuit. The common output terminal of current regulating circuit 2212 and reference current generator 2213 may be configured as output terminal $J_I$ of bias current generator 221. Thus, the regulating current and the reference current are parallel currents, and the current generated at terminal $J_I$ may be the sum of the regulating and reference currents. Reference current generator 2213 can include reference current source $A_{ref}$ that can generate current $I_{ref}$ as the reference current. The reference current can thus be set according to various parameters of the switching power supply.

Counter circuit 2211 can include an N-bit up-down counter having a function selection input terminal that receives judging signal $D_{det}$, a clock control terminal that receives a pulse signal "clk" (e.g., short-pulse signal $R_{set}$), and an output terminal that generates an N-bit counting signal with $C_1, C_2 \ldots C_N$ (e.g., from low to high significant positions). When judging signal $D_{det}$ indicates that the body diode of synchronous power switch SW is conducting, the up-down counter may count down, so the N-bit counting signal $C_1, C_2 \ldots C_N$ can be decremented. Otherwise, when judging signal $D_{det}$ indicates that the body diode of synchronous power switch SW is not conducting, the up-down counter may count up, so the N-bit counting signal $C_1, C_2 \ldots C_N$ can be incremented.

Current regulating circuit 2212 can include N current branches, and each current branch can be formed, e.g., by a switch and a current source. Switches $S_1, S_2 \ldots S_N$ may respectively connect with current sources $A_1, A_2 \ldots A_N$ to form N current branches. For example, switch $S_i$ and current source $A_i$ can form one current branch, where i is in the range of 1 to N, so current L generated by current source $A_i$ can be the output current of the $i^{th}$ current branch. Each of the current branches may be controlled by a corresponding one of the N-bit counting signals in order to output the corresponding branch current, and the regulating current may be the sum of all of the output branch currents. The branch currents can thus be added such that the current generated at the output terminal is the sum of several current branches, by connecting the output terminals of the several current branches together.

The switch in each current branch can be controlled by a corresponding one of the N-bit wide digital bit string counting signal. In this particular example, the N-bit counting signal with $C_1, C_2 \ldots C_N$ can be respectively used to control switches $S_1, S_2 \ldots S_N$. Thus, $C_j$ can be used to control switch $S_j$, where j is in the range of 1 to N, and $I_1, I_2 \ldots I_N$ gradually increase in a substantially equal ratio sequence. In this particular example, the relationship of $I_1, I_2 \ldots I_N$ can be: $Ik=2^{k-1}I1$, where k is greater than 1 but less than or equal to N. When $C_j$ is 1, switch $S_j$ may be conducting, so current $I_j$ generated by current source $A_j$ can be configured as the branch current. Therefore, when judging signal $D_{det}$ indicates that the body diode of synchronous power switch SW is conducting, the N-bit counting signal with $C_1, C_2 \ldots C_N$ may be decremented so as to gradually reduce the regulating current. When judging signal $D_{det}$ indicates that the body diode of synchronous power switch SW is not conducting, the N-bit counting signal with $C_1, C_2 \ldots C_N$ may be incremented in order to gradually increase the regulating current.

Comparison circuit 23 in FIG. 3 can include comparator $CP_A$ with a non-inverting input terminal connected to terminal $J_v$ of regulating switch SD to receive detection voltage $V_{RP}$. Comparator $CP_A$ can also include an inverting input terminal that receives voltage $V_{B2}$ at the second terminal of synchronous power switch SW, and an output terminal that generates zero-crossing detection signal ZX. Also in certain embodiments, a switching power supply can include any of the above described zero-crossing detection circuits and synchronous power switches. The switching power supply can have any suitable topology, such as a buck-type synchronous switching power supply or a boost-type synchronous switching power supply.

In particular embodiments, a zero-crossing detection circuit and switching power supply thereof may determine if the body diode of a synchronous power switch is conducting when the synchronous power switch is turned off by a state judging circuit. In response, a regulation voltage that changes along with the state of the body diode can be generated by a regulation voltage generator. A voltage obtained by adding the regulation voltage with a voltage at the first terminal of the synchronous power switch can be compared with a voltage at the second terminal of the synchronous power switch in order to generate a zero-crossing detection signal. To accommodate different cases with different output voltages, the zero-crossing detection circuit can control the synchronous power switch to be turned off when the inductor current is near zero, so as to effectively reduce power losses and improve the efficiency of the switching power supply.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A zero-crossing detection circuit, comprising:
   a) a state judging circuit configured to generate a judging signal based on whether a body diode of a synchronous power switch is conducting when said synchronous power switch is off;
   b) a regulation voltage generator configured to reduce a regulation voltage when said judging signal indicates that said body diode is conducting, and to increase said regulation voltage when said judging signal indicates that said body diode is not conducting, wherein a detection voltage comprises a sum of said regulation voltage and a voltage at a first terminal of said synchronous power switch; and
   c) a first comparison circuit configured to compare said detection voltage against a voltage at a second terminal of said synchronous power switch, and to generate a zero-crossing detection signal, wherein said zero-crossing detection signal is activated to turn off said synchronous power switch when said detection voltage equals said voltage at said second terminal of said synchronous power switch.

2. The zero-crossing detection circuit of claim 1, wherein said state judging circuit comprises:
   a) a second comparison circuit configured to compare a voltage difference between said voltages at said first and second terminals of said synchronous power switch against a threshold voltage when said synchronous power switch is off, and to generate said judging signal; and
   b) wherein said judging signal indicates that said body diode is conducting when said voltage difference is greater than said threshold voltage, and indicates that said body diode is not conducting when said voltage difference is less than said threshold voltage.

3. The zero-crossing detection circuit of claim 2, wherein said second terminal of said synchronous power switch is grounded, and said second comparison circuit comprises:
   a) a threshold voltage generator configured to generate said threshold voltage with a value less than a forward conduction voltage of said body diode;
   b) a first input terminal configured to receive a superposition voltage of said threshold voltage and said voltage at said first terminal of said synchronous power switch, a second input terminal to receive said voltage at said second terminal of said synchronous power switch, and a comparator output terminal;
   c) a short-pulse signal generator configured to generate a short-pulse signal according to a switching control signal of said synchronous power switch; and d) an RS flip-flop having a first input terminal coupled to said comparator output terminal, a second input terminal coupled to said short-pulse signal, and an output terminal configured to generate said judging signal.

4. The zero-crossing detection circuit of claim 3, wherein said threshold voltage generator comprises a first resistor coupled to a first current source, said first resistor having a first terminal coupled to said first terminal of said synchronous power switch, and a second terminal coupled to said first current source, wherein a voltage across said first resistor is configured as said threshold voltage.

5. The zero-crossing detection circuit of claim 4, wherein said second comparison circuit further comprises:
   a) a second resistor having a first terminal coupled to said second terminal of said first resistor, and a second terminal coupled to said first input terminal of said second comparator; and
   b) a first capacitor coupled between said second terminal of said second resistor and ground.

6. The zero-crossing detection circuit of claim 1, wherein said regulation voltage generator comprises:
   a) a bias current generator configured to generate a bias current that decreases when said judging signal indicates that said body diode is conducting, and increases when said judging signal indicates that said body diode is not conducting;
   b) a regulating switch configured to receive said bias current at a first terminal, and to output said bias current at a second terminal, wherein a conduction voltage of said regulating switch comprises said regulation voltage; and
   c) wherein said regulating switch is on when said synchronous power switch is conducting, said second terminal of said regulating switch is coupled to said first terminal of said synchronous power switch, and a voltage at said first terminal of said regulating switch is configured as said detection voltage.

7. The zero-crossing detection circuit of claim 6, wherein said bias current generator comprises:
   a) a counter circuit configured to generate a counting signal according to said judging signal when said synchronous power switch is turned off;
   b) a current regulating circuit controllable by said counting signal to output a regulating current that decreases when said judging signal indicates that said body diode is conducting, and increases when said judging signal indicates that said body diode is not conducting; and
   c) a reference current generator configured to generate a reference current, wherein a superposition current of said regulating current and said reference current is configured as said bias current.

8. The zero-crossing detection circuit of claim 7, said counter circuit comprises an N-bit up-down counter having a function selection terminal configured to receive said judging signal, a clock control terminal configured to receive a pulse signal based on a switching control signal of said synchronous power switch, and an output terminal configured to generate said counting signal, wherein said up-down counter is configured to count down when said judging signal indicates that said body diode is conducting, and to count up when said judging signal indicates that said body diode is not conducting; and
   said current regulating circuit comprises N current branches, wherein each of said N current branches is controllable by a corresponding bit of said counting signal to output a corresponding branch current, wherein said regulating current comprises a sum of said branch currents, and wherein N is an integer number greater than 0.

9. The zero-crossing detection circuit of claim 8, wherein each of said N current branches comprises a switch and a current source, said switch of said N current branches being controllable by said corresponding bit of said counting signal.

10. A switching power supply, comprising said synchronous power switch and said zero-crossing detection circuit of claim 1.

* * * * *